US012407307B2

(12) United States Patent
Tahara et al.

(10) Patent No.: US 12,407,307 B2
(45) Date of Patent: Sep. 2, 2025

(54) POWER AMPLIFICATION CIRCUIT, RADIO-FREQUENCY CIRCUIT, AND COMMUNICATION DEVICE

(71) Applicant: Murata Manufacturing Co., Ltd., Kyoto (JP)

(72) Inventors: Kenji Tahara, Kyoto (JP); Kenichi Shimamoto, Kyoto (JP); Takashi Yamada, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 640 days.

(21) Appl. No.: 17/807,188

(22) Filed: Jun. 16, 2022

(65) Prior Publication Data

US 2022/0311395 A1    Sep. 29, 2022

Related U.S. Application Data

(63) Continuation of application No. PCT/JP2020/041763, filed on Nov. 9, 2020.

(30) Foreign Application Priority Data

Feb. 7, 2020 (JP) ................. 2020-019942

(51) Int. Cl.
*H03F 1/02* (2006.01)
*H03F 1/30* (2006.01)
(Continued)

(52) U.S. Cl.
CPC ............ *H03F 3/245* (2013.01); *H03F 1/301* (2013.01); *H03F 1/302* (2013.01); *H03F 3/195* (2013.01);
(Continued)

(58) Field of Classification Search
CPC ................................... H03F 1/02; H03F 1/07
(Continued)

(56) References Cited

U.S. PATENT DOCUMENTS 4,292,599 A * 9/1981 Bench ................ H03H 11/1213
330/306
5,629,648 A * 5/1997 Pratt ...................... H03F 3/211
330/296
(Continued)

FOREIGN PATENT DOCUMENTS

CN    103338009 A    10/2013
CN    104022741 A    9/2014
(Continued)

OTHER PUBLICATIONS

International Search Report for International Patent Application No. PCT/JP2020/041763 dated Feb. 2, 2021.

*Primary Examiner* — Henry Choe
(74) *Attorney, Agent, or Firm* — McDonald Hopkins LLC

(57) ABSTRACT

Gain is suppressed. In a power amplification circuit, a first transistor has a first input terminal, a first output terminal, and a first ground terminal. A second transistor has a second input terminal, a second output terminal, and a second ground terminal. The second input terminal is connected to the first input terminal. The second output terminal is connected to the first output terminal. A first bias circuit is connected to the first input terminal. A second bias circuit is connected to the second input terminal. A first resistor is connected between the first ground terminal and the ground. A second resistor is connected between the second ground terminal and the ground. The second resistor has a resistance value greater than that of the first resistor.

11 Claims, 4 Drawing Sheets

(51) Int. Cl.
*H03F 3/195* (2006.01)
*H03F 3/24* (2006.01)

(52) U.S. Cl.
CPC .. *H03F 2200/318* (2013.01); *H03F 2200/451* (2013.01)

(58) Field of Classification Search
USPC .............................................. 330/295, 124 R
See application file for complete search history.

(56) References Cited

U.S. PATENT DOCUMENTS

| | | | |
|---|---|---|---|
| 5,903,854 | A | 5/1999 | Abe et al. |
| 6,816,015 | B2 * | 11/2004 | Zhang ........................ H03F 3/68 330/296 |
| 2003/0011435 | A1 | 1/2003 | Mori et al. |
| 2003/0025555 | A1 | 2/2003 | Ohnishi et al. |
| 2007/0096823 | A1 | 5/2007 | Wang et al. |
| 2015/0222233 | A1 * | 8/2015 | Kimura ................. H03F 1/0294 330/295 |
| 2018/0358933 | A1 | 12/2018 | Matsui et al. |
| 2019/0280658 | A1 | 9/2019 | Morisawa et al. |

FOREIGN PATENT DOCUMENTS

| | | | |
|---|---|---|---|
| JP | H08-307159 | A | 11/1996 |
| JP | 2002-330030 | A | 11/2002 |
| JP | 2003-46340 | A | 2/2003 |
| JP | 2019-161640 | A | 9/2019 |
| WO | 02/056461 | A1 | 7/2002 |

* cited by examiner

POWER AMPLIFICATION CIRCUIT, RADIO-FREQUENCY CIRCUIT, AND COMMUNICATION DEVICE

CROSS REFERENCE TO RELATED APPLICATION

This is a continuation of International Application No. PCT/JP2020/041763 filed on Nov. 9, 2020, which claims priority from Japanese Patent Application No. 2020-019942 filed on Feb. 7, 2020. The contents of these applications are incorporated herein by reference in their entireties.

BACKGROUND ART

Technical Field

The present disclosure generally relates to a power amplification circuit, a radio-frequency circuit, and a communication device, and, more specifically, relates to a power amplification circuit that power-amplifies radio-frequency signals, a radio-frequency circuit that includes the power amplification circuit, and a communication device that includes the radio-frequency circuit.

In the related art, a known power amplification module includes a power amplification circuit and a control circuit (for example, see Patent Document 1).

The power amplification circuit amplifies the power of each RF (Radio Frequency) signal received by the power amplification circuit, and outputs the amplified signal. The power amplification circuit includes an amplifier circuit and a bias generating circuit. The amplifier circuit includes a first transistor and a second transistor.

The first transistor is a current amplification element (amplifier transistor) which amplifies, for output, a current received at its base. The first transistor is grounded at its emitter. The first transistor receives part of an RF signal at its base. The first transistor is supplied, at its base, with a first bias current from a transistor included in the bias generating circuit. The second transistor is a transistor smaller in size than the first transistor. Like the first transistor, the second transistor is a current amplification element (amplifier transistor) which amplifies, for output, a current received at its base. The second transistor is connected to the first transistor in parallel. The second transistor is connected, at its emitter, to a first terminal of a resistor element. The second transistor is supplied, at its base, a second bias current from the transistor in the bias circuit. The resistor element is connected, at its first terminal, to the emitter of the second transistor, and is grounded at its second terminal.

The control circuit is supplied with two control signals. The two control signals are, for example, control signals for switching between power modes of the power amplification module (for example, the high-power mode and the low-power mode).

Patent Document 1: Japanese Unexamined Patent Application Publication No. 2019-161640

BRIEF SUMMARY

The power amplification circuit described in Patent Document 1 causes the first transistor and the second transistor to operate in both the power modes (for example, the high-power mode and the low-power mode) different from each other, resulting in a difficulty in sufficiently suppressing the gain in a mode of lower output power (for example, the low-power mode).

The present disclosure provides a power amplification circuit, a radio-frequency circuit, and a communication device which enable suppression of the gain.

A power amplification circuit according to an aspect of the present disclosure power-amplifies a radio-frequency signal. The power amplification circuit includes a first transistor, a second transistor, a first bias circuit, a second bias circuit, a first resistor, and a second resistor. The first transistor has a first input terminal, a first output terminal, and a first ground terminal. The second transistor has a second input terminal, a second output terminal, and a second ground terminal. The second transistor is connected to the first input terminal at the second input terminal, and is connected to the first output terminal at the second output terminal. The first bias circuit is connected to the first input terminal. The second bias circuit is connected to the second input terminal. The first resistor is connected between the first ground terminal and the ground. The second resistor is connected between the second ground terminal and the ground. The second resistor has a resistance value greater than a resistance value of the first resistor.

A radio-frequency circuit according to an aspect of the present disclosure includes a power amplification circuit and a control circuit. The power amplification circuit power-amplifies a radio-frequency signal. The control circuit controls the power amplification circuit. The power amplification circuit includes a first transistor, a second transistor, a first bias circuit, a second bias circuit, and a resistor. The first transistor has a first input terminal, a first output terminal, and a first ground terminal. The second transistor has a second input terminal, a second output terminal, and a second ground terminal. The second transistor is connected to the first input terminal at the second input terminal, and is connected to the first output terminal at the second output terminal. The first bias circuit is connected to the first input terminal. The second bias circuit is connected to the second input terminal. The resistor is connected between the second ground terminal and the ground. In the power amplification circuit, the resistance value between the second ground terminal and the ground is greater than the resistance value between the first ground terminal and the ground. The power amplification circuit is capable of operating in a first power mode and in a second power mode in which the output power is lower than the output power in the first power mode. When the control circuit causes the power amplification circuit to operate in the first power mode, the control circuit causes the first transistor to be supplied with a first bias from the first bias circuit, and does not cause the second transistor to be supplied with a second bias from the second bias circuit. When the control circuit causes the power amplification circuit to operate in the second power mode, the control circuit does not cause the first transistor to be supplied with the first bias from the first bias circuit, and causes the second transistor to be supplied with the second bias from the second bias circuit.

A communication device according to an aspect of the present disclosure includes the radio-frequency circuit and a signal processing circuit. The signal processing circuit outputs a radio-frequency signal to the radio-frequency circuit.

The power amplification circuit, the radio-frequency circuit, and the communication device according to the aspects of the present disclosure enable suppression of the gain.

DETAILED DESCRIPTION

First Embodiment

A power amplification circuit 10 according to a first embodiment will be described below by referring to FIGS. 1 to 3.

(1) A Power Amplification Circuit, a Radio-Frequency Circuit, and a Communication Device

Figure 2:
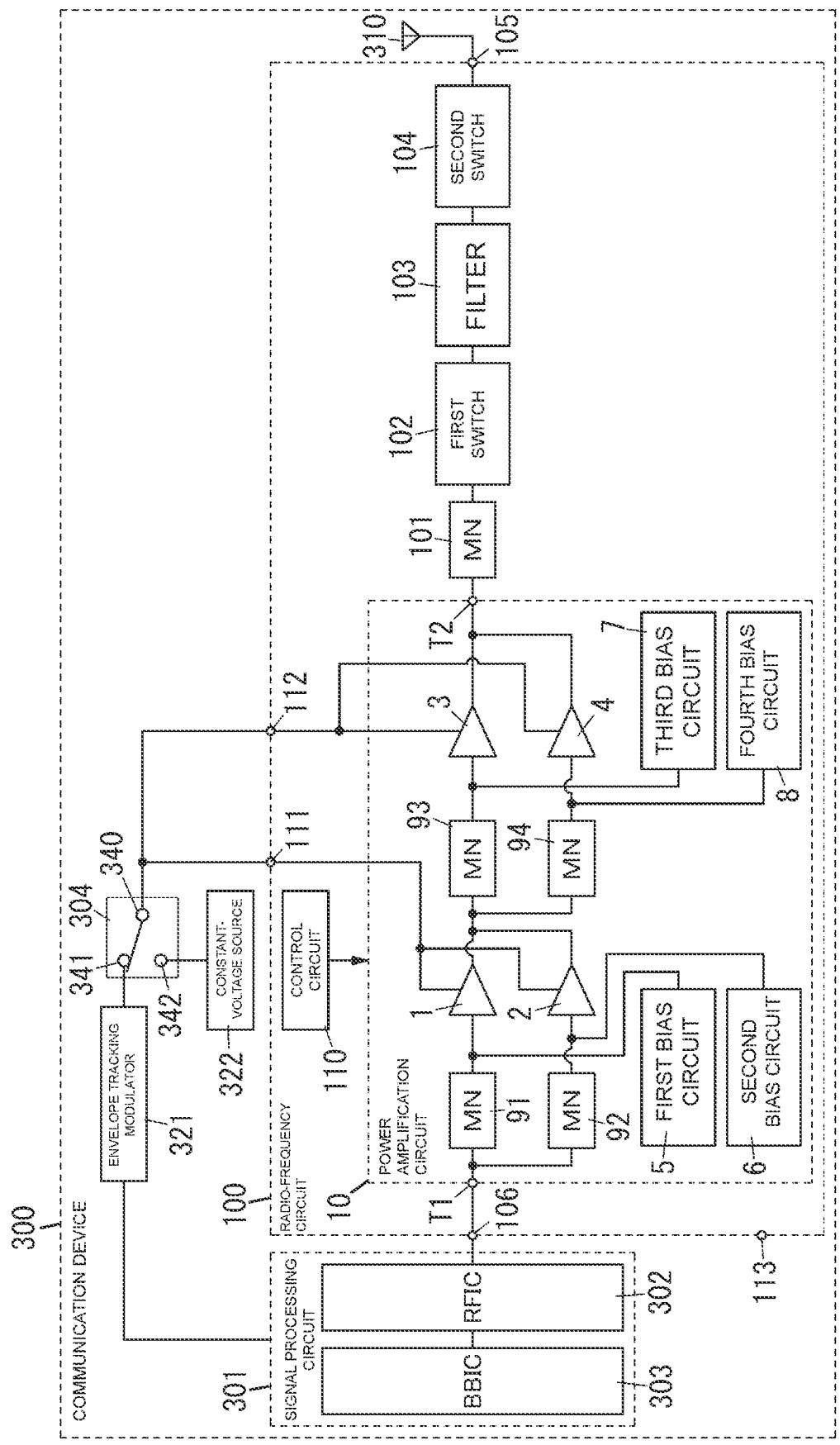
FIG. 2 is a circuit diagram of a communication device having a radio-frequency circuit including the power amplification circuit.

(1.1) The Circuit Configuration of a Radio-Frequency Circuit Having a Power Amplification Circuit A radio-frequency circuit 100 (see FIG. 2) having the power amplification circuit 10 is used, for example, in a communication device 300 (see FIG. 2). The communication device 300 is, for example, a cellular phone (for example, a smartphone), but is not limited to this. For example, the communication device 300 may be a wearable terminal (for example, a smartwatch). The radio-frequency circuit 100 is a circuit, for example, compatible with a 4G (fourth generation mobile communication) standard or a 5G (fifth generation mobile communication) standard. Such a 4G standard is, for example, the 3GPP LTE (Long Term Evolution) standard. Such a 5G standard is, for example, 5G NR (New Radio). The radio-frequency circuit may be a circuit compatible with carrier aggregation and dual connectivity.

For example, the radio-frequency circuit 100 amplifies radio-frequency signals (transmit signals) received from a signal processing circuit 301, and outputs the amplified signals to an antenna 310. The signal processing circuit 301 is not a component of the radio-frequency circuit 100, and is a component of the communication device 300 having the radio-frequency circuit 100. The radio-frequency circuit 100 is controlled, for example, by the signal processing circuit 301 included in the communication device 300.

The radio-frequency circuit 100 includes the power amplification circuit 10, an output matching circuit 101, a first switch 102, a filter 103, a second switch 104, an antenna terminal 105, a radio-frequency signal input terminal 106, a first power-supply terminal 111, and a second power-supply terminal 112.

Figure 1:
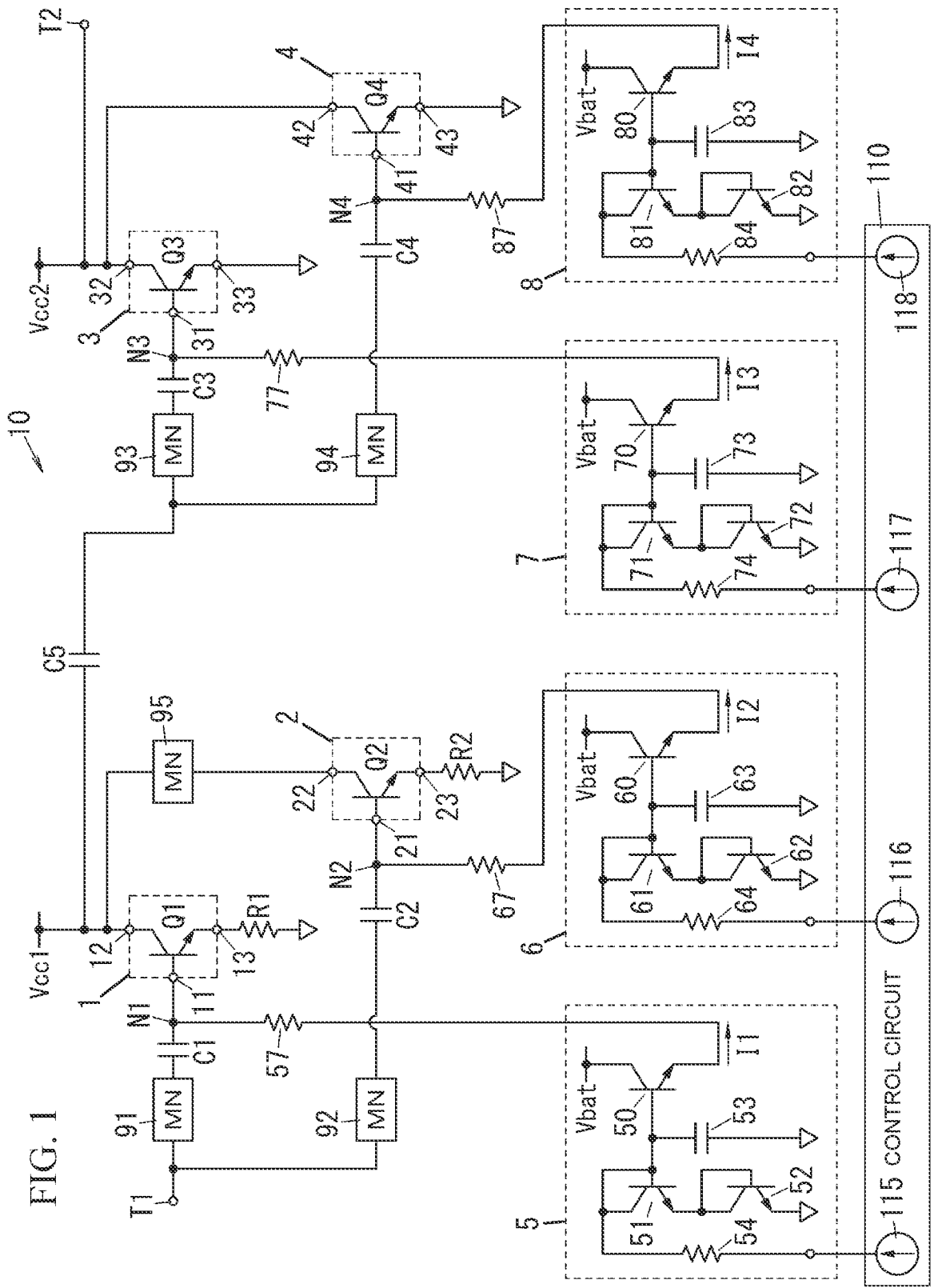
FIG. 1 is a circuit diagram of a power amplification circuit according to a first embodiment.

As illustrated in FIGS. 1 and 2, the power amplification circuit 10 includes a first amplifier 1, a second amplifier 2, a third amplifier 3, and a fourth amplifier 4. The first amplifier 1 includes a first transistor Q1. The second amplifier 2 includes a second transistor Q2. The third amplifier 3 includes a third transistor Q3. The fourth amplifier 4 includes a fourth transistor Q4. For example, the power amplification circuit 10 amplifies, for output, input signals from the signal processing circuit 301. The input signals are radio-frequency signals (transmit signals) in a given frequency band. For example, the given frequency band includes multiple communication bands different from each other.

The output matching circuit 101 is disposed on the signal path between the power amplification circuit 10 and the first switch 102. The output matching circuit 101 is a circuit for impedance matching between the power amplification circuit 10 and the filter 103. The output matching circuit 101 is formed, for example, of a single inductor. However, the configuration is not limited to this. For example, the output matching circuit 101 may include multiple inductors and multiple capacitors.

The first switch 102 is disposed between the output matching circuit 101 and the filter 103. The first switch 102 has a common terminal and multiple selection terminals. The first switch 102 is connected, at the common terminal, to the power amplification circuit 10 through the output matching circuit 101. The first switch 102 is connected to the filter 103 at one of the selection terminals. The first switch 102 is, for example, a switch capable of connecting the common terminal to at least one of the selection terminals. The first switch 102 is, for example, a switch enabling one-to-one connection and one-to-many connection. The first switch 102 is a switch capable of switching between signal paths for transmit signals having communication bands different from each other. The first switch 102 switches the connection state between the common terminal and the selection terminals, for example, in accordance with a control signal received from the signal processing circuit 301. The first switch 102 is, for example, a switch IC (Integrated Circuit). The first switch 102 may have any configuration as long as the connection state between the common terminal and the selection terminals is switched, for example, in accordance a digital control signal received from the signal processing circuit 301.

The filter 103 is a filter whose pass-band is the transmit band of one (for example, Band3) of the communication bands described above. The filter 103 is, for example, a single chip having an acoustic wave filter including multiple serial arm resonators and multiple parallel arm resonators, each of which is formed of an acoustic wave resonator. Such an acoustic wave filter is, for example, a surface acoustic wave filter using surface acoustic waves. The surface acoustic wave filter has multiple serial arm resonators and multiple parallel arm resonators, each of which is, for example, a SAW (Surface Acoustic Wave) resonator. The filter 103 is not limited to a single chip having an acoustic wave filter, and may have a package structure.

The second switch 104 is disposed between the filter 103 and the antenna terminal 105. The second switch 104 is a switch connected to the antenna terminal 105. The second switch 104 has a common terminal and multiple selection terminals. The second switch 104 is connected to the antenna terminal 105 at the common terminal. The second switch 104 is connected to the filter 103 at one of the selection terminals. The second switch 104 switches the connection state between the common terminal and the selection terminals, for example, in accordance with a control signal received from the signal processing circuit 301. The second switch 104 is, for example, a switch IC. The second switch 104 may have any configuration as long as the connection state between the common terminal and the selection terminals is switched, for example, in accordance with a digital control signal received from the signal processing circuit 301.

The antenna terminal 105 is connected to the antenna 310.

In the radio-frequency circuit 100, a radio-frequency signal (transmit signal), which is output from the power amplification circuit 10, is transmitted from the antenna 310 through the output matching circuit 101, the first switch 102, the filter 103, the second switch 104, and the antenna terminal 105.

In the radio-frequency circuit 100, the first power-supply terminal 111 is connected to the first amplifier 1 and the second amplifier 2. The second power-supply terminal 112 is connected to the third amplifier 3 and the fourth amplifier 4. The first power-supply terminal 111 and the second power-supply terminal 112 are connected selectively to an envelope tracking modulator 321 (hereinafter referred to as an ET modulator 321) and a constant-voltage source 322 through a switch 304. The ET modulator 321, the constant-voltage source 322, and the switch 304 are not components of the radio-frequency circuit 100, and are components of the communication device 300 having the radio-frequency circuit 100.

(1.2) The Circuit Configuration of the Communication Device Having the Radio-Frequency Circuit The communication device 300 includes the radio-frequency circuit 100 and the signal processing circuit 301. The communication device 300 further includes the antenna 310. The signal processing circuit 301 includes, for example, an RF-signal processing circuit 302 and a baseband-signal processing circuit 303. The RF-signal processing circuit 302 is, for example, an RFIC (Radio Frequency Integrated Circuit), and performs signal processing on a radio-frequency signal. For example, the RF-signal processing circuit 302 performs signal processing, such as upconverting, on a radio-frequency signal (transmit signal), which is output from the baseband-signal processing circuit 303, and outputs the radio-frequency signal having been subjected to the signal processing. The baseband-signal processing circuit 303 is, for example, a BBIC (Baseband Integrated Circuit). The baseband-signal processing circuit 303 generates an I-phase signal and a Q-phase signal from a baseband signal. A baseband signal is, for example, an audio signal or an image signal received from the outside. The baseband-signal processing circuit 303 performs IQ modulation by synthesizing an I-phase signal and a Q-phase signal, and outputs a transmit signal. At that time, a transmit signal is generated as a modulated signal (IQ signal) obtained through amplitude modulation of a carrier-wave signal, having a given frequency, with a period longer than that of the carrier-wave signal. The radio-frequency circuit 100 transmits a radio-frequency signal (transmit signal) between the antenna 310 and the RF-signal processing circuit 302 of the signal processing circuit 301.

The communication device 300 further includes the ET modulator 321, the constant-voltage source 322, and the switch 304 which are described above.

The ET modulator 321 detects the envelope of a signal which is output from the baseband-signal processing circuit 303. That is, the ET modulator 321 detects the waveform (envelope signal) of the amplitude modulation of the carrier-wave signal included in a transmit signal. Specifically, the ET modulator 321 detects an envelope signal from an I-phase signal and a Q-phase signal.

The ET modulator 321 uses the waveform of an envelope signal and a preset gain to determine supply voltages (a first supply voltage Vcc1 and a second supply voltage Vcc2). The period of the supply voltages is the same as that of the envelope signal. The amplitude variation of supply voltages is the same as that of the envelope signal. That is, the amplitude characteristics (the period and the amplitude variation) of the envelope signal are the same as those of the supply voltages. The ET modulator 321 outputs the supply voltages to the first power-supply terminal 111 and the second power-supply terminal 112. The supply voltage Vcc1 and the supply voltage Vcc2 change in synchronization with each other. That is, when the supply voltage Vcc1 increases, the supply voltage Vcc2 also increases. When the supply voltage Vcc1 decreases, the supply voltage Vcc2 also decreases.

The switch 304 has a common terminal 340, a first selection terminal 341, and a second selection terminal 342. The common terminal 340 is connected to both the first power-supply terminal 111 and the second power-supply terminal 112. The first selection terminal 341 is connected to the ET modulator 321. The second selection terminal 342 is connected to the constant-voltage source 322. The switch 304 is controlled, for example, by the signal processing circuit 301 so that the common terminal 340 is connected selectively to either one of the first selection terminal 341 and the second selection terminal 342.

When the communication device 300 causes the power amplification circuit 10 to perform envelope tracking operation, the communication device 300 causes the ET modulator 321 to supply the first power-supply terminal 111 and the second power-supply terminal 112 with the supply voltages amplitude-modulated in accordance with the amplitude level of a radio-frequency signal (transmit signal) received by the power amplification circuit 10 from the signal processing circuit 301. When the communication device 300 does not cause the power amplification circuit 10 to perform envelope tracking operation, the communication device 300 causes the first power-supply terminal 111 and the second power-supply terminal 112 to be supplied with a constant supply voltage which is output from the constant-voltage source 322. The power amplification circuit 10 is capable of operating, for example, in a first power mode (for example, the high-power mode) and in a second power mode (for example, the low-power mode) in which the output power is lower than that in the first power mode. When the power amplification circuit 10 is in the high-power mode, the output power is set to a first given power (for example, 26 dBm). When the power amplification circuit 10 is in the low-power mode, the output power is set to a second given power (for example, 15 dBm) lower than the first given power.

When the power amplification circuit 10 operates in the high-power mode, amplitude-modulated supply voltages are supplied to the first amplifier 1, the third amplifier 3, and the fourth amplifier 4 from the ET modulator 321. When the power amplification circuit 10 operates in the low-power mode, the constant supply voltage is supplied to the second amplifier 2 and the third amplifier 3 from the constant-voltage source 322.

The power amplification circuit 10 according to the first embodiment includes a first resistor R1 connected between the first transistor Q1 and the ground, and a second resistor R2 connected between the ground and the second transistor Q2 which is connected to the first transistor Q1 in parallel. The resistance value of the second resistor R2 is greater than that of the first resistor R1. This achieves suppression of the gain, which is obtained when the power amplification circuit 10 operates in the second power mode, in the following manner: when the power amplification circuit 10 according to the first embodiment operates in the first power mode, only the first transistor Q1 among the first transistor Q1 and the second transistor Q2 is used; when the power amplification circuit 10 operates in the second power mode, only the second transistor Q2 among the first transistor Q1 and the second transistor Q2 is used.

(1.3) The Circuit Configuration of the Power Amplification Circuit

The power amplification circuit 10 includes the first amplifier 1, the second amplifier 2, the third amplifier 3, the fourth amplifier 4, a first bias circuit 5, a second bias circuit 6, a third bias circuit 7, and a fourth bias circuit 8. The power amplification circuit 10 further includes a signal input terminal T1, a signal output terminal T2, a first matching circuit 91, a second matching circuit 92, a third matching circuit 93, and a fourth matching circuit 94.

As illustrated in FIG. 1, in the power amplification circuit 10, the first amplifier 1, the second amplifier 2, the third amplifier 3, and the fourth amplifier 4 include the first transistor Q1, the second transistor Q2, the third transistor Q3, and the fourth transistor Q4, respectively. The first transistor Q1, the second transistor Q2, the third transistor Q3, and the fourth transistor Q4 are amplifier transistors which power-amplify radio-frequency signals.

The power amplification circuit 10 includes the first transistor Q1, the second transistor Q2, the third transistor Q3, the fourth transistor Q4, the first bias circuit 5, the second bias circuit 6, the third bias circuit 7, and the fourth bias circuit 8.

Each of the first transistor Q1, the second transistor Q2, the third transistor Q3, and the fourth transistor Q4 is, for example, a bipolar transistor. Each of the first transistor Q1, the second transistor Q2, the third transistor Q3, and the fourth transistor Q4 is an npn bipolar transistor.

The first transistor Q1 has a first input terminal 11, a first output terminal 12, and a first ground terminal 13. In the first transistor Q1, the first input terminal 11, the first output terminal 12, and the first ground terminal 13 are a first base terminal, a first collector terminal, and a first emitter terminal, respectively. The first input terminal 11 of the first transistor Q1 is connected to the signal input terminal T1. The first ground terminal 13 of the first transistor Q1 is connected to the ground. The first output terminal 12 of the first transistor Q1 is connected to the first power-supply terminal 111 (see FIG. 2) of the radio-frequency circuit 100, and is supplied with the supply voltage Vcc1. The first transistor Q1 amplifies a radio-frequency signal received at the first input terminal 11, and outputs the amplified signal from the first output terminal 12.

The second transistor Q2 has a second input terminal 21, a second output terminal 22, and a second ground terminal 23. In the second transistor Q2, the second input terminal 21, the second output terminal 22, and the second ground terminal 23 are a second base terminal, a second collector terminal, and a second emitter terminal, respectively. The second input terminal 21 of the second transistor Q2 is connected to the signal input terminal T1. The second ground terminal 23 of the second transistor Q2 is connected to the ground. The second output terminal 22 of the second transistor Q2 is connected to the first power-supply terminal 111 of the radio-frequency circuit 100, and is supplied with the supply voltage Vcc1. The second transistor Q2 amplifies a radio-frequency signal received at the second input terminal 21, and outputs the amplified signal from the second output terminal 22. The second transistor Q2 is connected to the first transistor Q1 in parallel. The second input terminal 21 of the second transistor Q2 is connected to the first input terminal 11 of the first transistor Q1. The second output terminal 22 of the second transistor Q2 is connected to the first output terminal 12 of the first transistor Q1. The power amplification circuit 10 includes a driving-stage amplifier circuit and an output-stage (final-stage) amplifier circuit. In the power amplification circuit 10, the driving-stage amplifier circuit includes the first transistor Q1 and the second transistor Q2.

The third transistor Q3 has a third input terminal 31, a third output terminal 32, and a third ground terminal 33. In the third transistor Q3, the third input terminal 31, the third output terminal 32, and the third ground terminal 33 are a third base terminal, a third collector terminal, and a third emitter terminal, respectively. The third input terminal 31 of the third transistor Q3 is connected to the first output terminal 12 of the first transistor Q1 and the second output terminal 22 of the second transistor Q2. The third ground terminal 33 of the third transistor Q3 is connected to the ground. The third output terminal 32 of the third transistor Q3 is connected to the second power-supply terminal 112 (see FIG. 2) of the radio-frequency circuit 100, and is supplied with the supply voltage Vcc2. The third transistor Q3 amplifies a radio-frequency signal received at the third input terminal 31, and outputs the amplified signal from the third output terminal 32.

The fourth transistor Q4 has a fourth input terminal 41, a fourth output terminal 42, and a fourth ground terminal 43. In the fourth transistor Q4, the fourth input terminal 41, the fourth output terminal 42, and the fourth ground terminal 43 are a fourth base terminal, a fourth collector terminal, and a fourth emitter terminal, respectively. The fourth input terminal 41 of the fourth transistor Q4 is connected to the first output terminal 12 of the first transistor Q1 and the second output terminal 22 of the second transistor Q2. The fourth ground terminal 43 of the fourth transistor Q4 is connected to the ground. The fourth output terminal 42 of the fourth transistor Q4 is connected to the second power-supply terminal 112 of the radio-frequency circuit 100, and is supplied with the supply voltage Vcc2. The fourth transistor Q4 amplifies a radio-frequency signal received at the fourth input terminal 41, and outputs the amplified signal from the fourth output terminal 42. The fourth transistor Q4 is connected to the third transistor Q3 in parallel. The fourth input terminal 41 of the fourth transistor Q4 is connected to the third input terminal 31 of the third transistor Q3. The fourth output terminal 42 of the fourth transistor Q4 is connected to the third output terminal 32 of the third transistor Q3. In the power amplification circuit 10, the output-stage amplifier circuit includes the third transistor Q3 and the fourth transistor Q4.

The signal input terminal T1 is a terminal at which a radio-frequency signal is received. More specifically, the signal input terminal T1 is a terminal, for example, at which a radio-frequency signal from the signal processing circuit 301 is received through the radio-frequency signal input terminal 106 of the radio-frequency circuit 100. In the power amplification circuit 10, the first input terminal 11 of the first transistor Q1 and the second input terminal 21 of the second transistor Q2 are connected to the signal input terminal T1.

The signal output terminal T2 is a terminal from which a radio-frequency signal, having been amplified in the power amplification circuit 10, is output. In the power amplification circuit 10, the third output terminal 32 of the third transistor Q3 and the fourth output terminal 42 of the fourth transistor Q4 are connected to the signal output terminal T2.

The first bias circuit 5 is connected to the first input terminal 11 of the first transistor Q1. The first bias circuit 5 supplies a first bias to the first transistor Q1. More specifically, the first bias circuit 5 supplies a first bias current I1 to the first input terminal 11 of the first transistor Q1.

The first bias circuit 5 includes a transistor 50. The transistor 50 has a control terminal, a first main terminal, and a second main terminal. The transistor 50 is, for example, an npn bipolar transistor. In this case, the control terminal, the first main terminal, and the second main terminal in the transistor 50 are its base, its collector, and its emitter, respectively. The transistor 50 is connected, at its collector, to a third power-supply terminal 113 of the radio-frequency circuit 100, and is connected, at its emitter, to the first input terminal 11 of the first transistor Q1. More specifically, the transistor 50 is connected, at its emitter, to the first input terminal 11 of the first transistor Q1 through a resistor 57. The third power-supply terminal 113 is supplied, for example, with a substantially-constant voltage Vbat from a battery. The first bias current I1, which is output from the first bias circuit 5, is supplied to the first input terminal 11 of the first transistor Q1 through the resistor 57. The first bias current I1 is a direct current which determines the operating point of the first transistor Q1. In the first bias circuit 5, the transistor 50 is used as an emitter-follower transistor. The transistor 50 is a transistor for amplifying a current.

The first bias circuit 5 includes two diodes 51 and 52, a capacitor 53, and a resistor 54 in addition to the transistor 50. Each of the diodes 51 and 52 is formed by connecting the base to the collector of the corresponding npn transistor.

In the first bias circuit 5, the two diodes 51 and 52 are connected to each other in series between the ground and the base of the transistor 50. In the first bias circuit 5, the base of the transistor 50 is connected through the resistor 54 to a first constant-current source 115 included in a control circuit 110 in the radio-frequency circuit 100. In the first bias circuit 5, the capacitor 53 is connected between the ground and the base of the transistor 50.

In the first bias circuit 5, a constant current, which is output from the first constant-current source 115, is received at the base of the transistor 50. The constant current is amplified to obtain the first bias current I1 which is output from the emitter of the transistor 50. The first bias current I1, which is output from the emitter of the transistor 50, is supplied to the first input terminal 11 of the first transistor Q1 through the resistor 57. The resistor 57 may be included in the first bias circuit 5.

The second bias circuit 6 is connected to the second input terminal 21 of the second transistor Q2. The second bias circuit 6 supplies a second bias to the second transistor Q2. More specifically, the second bias circuit 6 supplies a second bias current I2 to the second input terminal 21 of the second transistor Q2.

The second bias circuit 6 includes a transistor 60. The transistor 60 has a control terminal, a first main terminal, and a second main terminal. The transistor 60 is, for example, an npn bipolar transistor. In this case, the control terminal, the first main terminal, and the second main terminal in the transistor 60 are its base, its collector, and its emitter, respectively. The transistor 60 is connected, at its collector, to the third power-supply terminal 113 of the radio-frequency circuit 100, and is connected, at its emitter, to the second input terminal 21 of the second transistor Q2. More specifically, the transistor 60 is connected, at its emitter, to the second input terminal 21 of the second transistor Q2 through a resistor 67. The third power-supply terminal 113 is supplied with the substantially-constant voltage Vbat from the battery. The second bias current I2, which is output from the second bias circuit 6, is supplied to the second input terminal 21 of the second transistor Q2 through the resistor 67. The second bias current I2 is a direct current which determines the operating point of the second transistor Q2.

In the second bias circuit 6, the transistor 60 is used as an emitter-follower transistor. The transistor 60 is a transistor for amplifying a current.

The second bias circuit 6 includes two diodes 61 and 62, a capacitor 63, and a resistor 64 in addition to the transistor 60. Each of the two diodes 61 and 62 is formed by connecting the base to the collector of the corresponding npn transistor.

In the second bias circuit 6, the two diodes 61 and 62 are connected to each other in series between the ground and the base of the transistor 60. In the second bias circuit 6, the base of the transistor 60 is connected through the resistor 64 to a second constant-current source 116 included in the control circuit 110. In the second bias circuit 6, the capacitor 63 is connected between the ground and the base of the transistor 60.

In the second bias circuit 6, a constant current, which is output from the second constant-current source 116, is received at the base of the transistor 60. The constant current is amplified to obtain the second bias current I2 which is output from the emitter of the transistor 60. The second bias current I2, which is output from the emitter of the transistor 60, is supplied to the second input terminal 21 of the second transistor Q2 through the resistor 67. The resistor 67 may be included in the second bias circuit 6.

The third bias circuit 7 is connected to the third input terminal 31 of the third transistor Q3. The third bias circuit 7 supplies a third bias to the third transistor Q3. More specifically, the third bias circuit 7 supplies a third bias current I3 to the third input terminal 31 of the third transistor Q3.

The third bias circuit 7 includes a transistor 70. The transistor 70 has a control terminal, a first main terminal, and a second main terminal. The transistor 70 is, for example, an npn bipolar transistor. In this case, the control terminal, the first main terminal, and the second main terminal in the transistor 70 are its base, its collector, and its emitter, respectively. The transistor 70 is connected, at its collector, to the third power-supply terminal 113 of the radio-frequency circuit 100, and is connected, at its emitter, to the third input terminal 31 of the third transistor Q3. More specifically, the transistor 70 is connected, at its emitter, to the third input terminal 31 of the third transistor Q3 through a resistor 77. The third power-supply terminal 113 is supplied with the substantially-constant voltage Vbat from the battery. The third bias current I3, which is output from the third bias circuit 7, is supplied to the third input terminal 31 of the third transistor Q3 through the resistor 77. The third bias current I3 is a direct current which determines the operating point of the third transistor Q3. In the third bias circuit 7, the transistor 70 is used as an emitter-follower transistor. The transistor 70 is a transistor for amplifying a current.

The third bias circuit 7 includes two diodes 71 and 72, a capacitor 73, and a resistor 74 in addition to the transistor 70. Each of the two diodes 71 and 72 is formed by connecting the base to the collector of the corresponding npn transistor.

In the third bias circuit 7, the two diodes 71 and 72 are connected to each other in series between the ground and the base of the transistor 70. In the third bias circuit 7, the base of the transistor 70 is connected through the resistor 74 to a third constant-current source 117 included in the control circuit 110. In the third bias circuit 7, the capacitor 73 is connected between the ground and the base of the transistor 70.

In the third bias circuit 7, a constant current, which is output from the third constant-current source 117, is received at the base of the transistor 70. The constant current is amplified to obtain the third bias current I3 which is output from the emitter of the transistor 70. The third bias current I3, which is output from the emitter of the transistor 70, is supplied to the third input terminal 31 of the third transistor Q3 through the resistor 77. The resistor 77 may be included in the third bias circuit 7.

The fourth bias circuit 8 is connected to the fourth input terminal 41 of the fourth transistor Q4. The fourth bias circuit 8 supplies a fourth bias to the fourth transistor Q4. More specifically, the fourth bias circuit 8 supplies a fourth bias current I4 to the fourth input terminal 41 of the fourth transistor Q4.

The fourth bias circuit 8 includes a transistor 80. The transistor 80 has a control terminal, a first main terminal, and a second main terminal. The transistor 80 is, for example, an npn bipolar transistor. In this case, the control terminal, the first main terminal, and the second main terminal in the transistor 80 are its base, its collector, and its emitter, respectively. The transistor 80 is connected, at its collector, to the third power-supply terminal 113 of the radio-frequency circuit 100, and is connected, at its emitter, to the fourth input terminal 41 of the fourth transistor Q4. More specifically, the transistor 80 is connected, at its emitter, to the fourth input terminal 41 of the fourth transistor Q4 through a resistor 87. The third power-supply terminal 113 is supplied with the substantially-constant voltage Vbat from the battery. The fourth bias current I4, which is output from the fourth bias circuit 8, is supplied to the fourth input terminal 41 of the fourth transistor Q4 through the resistor 87. The fourth bias current I4 is a direct current which determines the operating point of the fourth transistor Q4. In the fourth bias circuit 8, the transistor 80 is used as an emitter-follower transistor. The transistor 80 is a transistor for amplifying a current.

The fourth bias circuit 8 includes two diodes 81 and 82, a capacitor 83, and a resistor 84 in addition to the transistor 80. Each of the two diodes 81 and 82 is formed by connecting the base to the collector of the corresponding npn transistor.

In the fourth bias circuit 8, the two diodes 81 and 82 are connected to each other in series between the ground and the base of the transistor 80. In the fourth bias circuit 8, the base of the transistor 80 is connected through the resistor 84 to a fourth constant-current source 118 included in the control circuit 110. In the fourth bias circuit 8, the capacitor 83 is connected between the ground and the base of the transistor 80.

In the fourth bias circuit 8, a constant current, which is output from the fourth constant-current source 118, is received at the base of the transistor 80. The constant current is amplified to obtain the fourth bias current I4 which is output from the emitter of the transistor 80. The fourth bias current I4, which is output from the emitter of the transistor 80, is supplied to the fourth input terminal 41 of the fourth transistor Q4 through the resistor 87. The resistor 87 may be included in the fourth bias circuit 8.

The first matching circuit 91 is disposed between the signal input terminal T1 and the first input terminal 11 of the first transistor Q1. The first matching circuit 91 is a circuit for impedance matching between the first transistor Q1 and the signal processing circuit 301. The first matching circuit 91 includes, for example, at least one of the following devices: one resistor; one capacitor; and one inductor. However, the configuration is not limited to this.

The second matching circuit 92 is disposed between the signal input terminal T1 and the second input terminal 21 of the second transistor Q2. The second matching circuit 92 is a circuit for impedance matching between the second transistor Q2 and the signal processing circuit 301. The second matching circuit 92 includes, for example, at least one of the following devices: one resistor; one capacitor; and one inductor. However, the configuration is not limited to this.

The third matching circuit 93 is disposed following the first output terminal 12 of the first transistor Q1 and the second output terminal 22 of the second transistor Q2 and preceding the third input terminal 31 of the third transistor Q3. The third matching circuit 93 is a circuit (interstage matching circuit) for impedance matching between the first and second transistors Q1 and Q2, and the third transistor Q3. The third matching circuit 93 includes, for example, at least one of the following devices: one resistor; one capacitor; and one inductor. However, the configuration is not limited to this.

The fourth matching circuit 94 is disposed following the first output terminal 12 of the first transistor Q1 and the second output terminal 22 of the second transistor Q2 and preceding the fourth input terminal 41 of the fourth transistor Q4. The fourth matching circuit 94 is a circuit (interstage matching circuit) for impedance matching between the first transistor Q1 and the second transistor Q2, and the fourth transistor Q4. The fourth matching circuit 94 includes, for example, at least one of the following devices: one resistor; one capacitor; and one inductor. However, the configuration is not limited to this.

The power amplification circuit 10 further includes a matching circuit 95. The matching circuit 95 is connected between the first output terminal 12 of the first transistor Q1 and the second output terminal 22 of the second transistor Q2. The matching circuit 95 includes, for example, one capacitor and one inductor. However, the configuration is not limited to this.

The power amplification circuit 10 further includes a first capacitor C1, a second capacitor C2, a third capacitor C3, and a fourth capacitor C4. The first capacitor C1, the second capacitor C2, the third capacitor C3, and the fourth capacitor C4 are capacitive elements for cutting direct current.

The first capacitor C1 is disposed between the first matching circuit 91 and the first input terminal 11 of the first transistor Q1. The first capacitor C1 is connected, at its first end, to the first matching circuit 91, and is connected, at its second end, to the first input terminal 11. The first bias circuit 5 described above is connected through the resistor 57 to a first node N1 on the path between the first capacitor C1 and the first input terminal 11. The first capacitor C1 may be included in the first matching circuit 91.

The second capacitor C2 is disposed between the second matching circuit 92 and the second input terminal 21 of the second transistor Q2. The second capacitor C2 is connected, at its first end, to the second matching circuit 92, and is connected, at its second end, to the second input terminal 21. The second bias circuit 6 described above is connected through the resistor 67 to a second node N2 on the path between the second capacitor C2 and the second input terminal 21. The second capacitor C2 may be included in the second matching circuit 92.

The third capacitor C3 is disposed between the third matching circuit 93 and the third input terminal 31 of the third transistor Q3. The third capacitor C3 is connected, at its first end, to the third matching circuit 93, and is connected, at its second end, to the third input terminal 31. The third bias circuit 7 described above is connected through the resistor 77 to a third node N3 on the path between the third capacitor C3 and the third input terminal 31. The third capacitor C3 may be included in the third matching circuit 93.

The fourth capacitor C4 is disposed between the fourth matching circuit 94 and the fourth input terminal 41 of the fourth transistor Q4. The fourth capacitor C4 is connected, at its first end, to the fourth matching circuit 94, and is connected, at its second end, to the fourth input terminal 41. The fourth bias circuit 8 described above is connected through the resistor 87 to a fourth node N4 on the path between the fourth capacitor C4 and the fourth input terminal 41. The fourth capacitor C4 may be included in the fourth matching circuit 94.

The power amplification circuit 10 further includes a capacitor C5. The capacitor C5 is connected between two output terminals, which are the first output terminal 12 of the first transistor Q1 and the second output terminal 22 of the second transistor Q2, and two matching circuits, which are the third matching circuit 93 and the fourth matching circuit 94.

The power amplification circuit 10 includes the first resistor R1 and the second resistor R2. The first resistor R1 is connected between the ground and the first ground terminal 13 of the first transistor Q1. The second resistor R2 is connected between the ground and the second ground terminal 23 of the second transistor Q2. The second resistor R2 has a resistance value greater than that of the first resistor R1. The second resistor R2 has a resistance value of at least twice that of the first resistor R1. For example, in the power amplification circuit 10, the first resistor R1 has a resistance value of 1Ω, and the second resistor R2 has a resistance value of 10Ω. The resistance values of the first resistor R1 and the second resistor R2 are not limited to this example.

(2) Operations of the Power Amplification Circuit, the Control Circuit, and the Communication Device For example, the power amplification circuit 10 amplifies, for output, radio-frequency signals (transmit signals) from the signal processing circuit 301. The power amplification circuit 10 amplifies radio-frequency signals received at the signal input terminal T1, and outputs the amplified radio-frequency signals from the signal output terminal T2.

The power amplification circuit 10 is capable of operating, for example, in the first power mode (for example, the high-power mode) and in the second power mode (for example, the low-power mode). The power amplification circuit 10 is controlled by the control circuit 110. The control circuit 110 is, for example, a control IC (Integrated Circuit) which controls the power amplification circuit 10. The control circuit 110 controls the first bias circuit 5, the second bias circuit 6, the third bias circuit 7, and the fourth bias circuit 8. As described above, the control circuit 110 is not a component of the power amplification circuit 10, and is a component of the radio-frequency circuit 100. The control circuit 110 includes the first constant-current source 115, the second constant-current source 116, the third constant-current source 117, and the fourth constant-current source 118 which are described above.

For example, the control circuit 110 is connected to the signal processing circuit 301. The control circuit 110 controls the power amplification circuit 10 on the basis of a control signal obtained from the signal processing circuit 301. For example, the control circuit 110 controls the power amplification circuit 10 in accordance with a control signal from the RF-signal processing circuit 302 of the signal processing circuit 301. The control circuit 110 may have any configuration as long as, for example, the control circuit 110 controls the power amplification circuit 10 on the basis of a digital control signal obtained from the signal processing circuit 301.

When the control circuit 110 causes the power amplification circuit 10 to operate in the first power mode, for example, the control circuit 110 supplies the first bias circuit 5, the third bias circuit 7, and the fourth bias circuit 8 with constant currents from the first constant-current source 115, the third constant-current source 117, and the fourth constant-current source 118, respectively. That is, when the control circuit 110 causes the power amplification circuit 10 to operate in the first power mode, the control circuit 110 controls the first bias circuit 5, the third bias circuit 7, and the fourth bias circuit 8 so that radio-frequency signals, which are received by the first transistor Q1, the third transistor Q3, and the fourth transistor Q4, respectively, are amplified for output. When the control circuit 110 causes the power amplification circuit 10 to operate in the first power mode, the control circuit 110 causes the first transistor Q1 to be supplied with the first bias current I1 from the first bias circuit 5, and does not cause the second transistor Q2 to be supplied with the second bias current I2 from the second bias circuit 6. In addition, when the control circuit 110 causes the power amplification circuit 10 to operate in the first power mode, the control circuit 110 causes the third transistor Q3 to be supplied with the third bias current I3 from the third bias circuit 7, and causes the fourth transistor Q4 to be supplied with the fourth bias current I4 from the fourth bias circuit 8. Therefore, when the power amplification circuit 10 operates in the first power mode, the first transistor Q1, the third transistor Q3, and the fourth transistor Q4 perform amplification, and the second transistor Q2 does not perform amplification.

When the control circuit 110 causes the power amplification circuit 10 to operate in the second power mode, for example, the control circuit 110 supplies the second bias circuit 6 and the third bias circuit 7 with constant currents from the second constant-current source 116 and the third constant-current source 117, respectively. That is, when the control circuit 110 causes the power amplification circuit 10 to operate in the second power mode, the control circuit 110 controls the second bias circuit 6 and the third bias circuit 7 so that radio-frequency signals, which are received by the second transistor Q2 and the third transistor Q3, respectively, are amplified for output. When the control circuit 110 causes the power amplification circuit 10 to operate in the second power mode, the control circuit 110 does not cause the first transistor Q1 to be supplied with the first bias current I1 from the first bias circuit 5, and causes the second transistor Q2 to be supplied with the second bias current I2 from the second bias circuit 6. When the control circuit 110 causes the power amplification circuit 10 to operate in the second power mode, the control circuit 110 causes the third transistor Q3 to be supplied with the third bias current I3 from the third bias circuit 7, and does not cause the fourth transistor Q4 to be supplied with the fourth bias current I4 from the fourth bias circuit 8. Therefore, when the power amplification circuit 10 operates in the second power mode, the second transistor Q2 and the third transistor Q3 perform amplification, and the first transistor Q1 and the fourth transistor Q4 do not perform amplification.

(3) Characteristics of the Power Amplification Circuit

Figure 3:
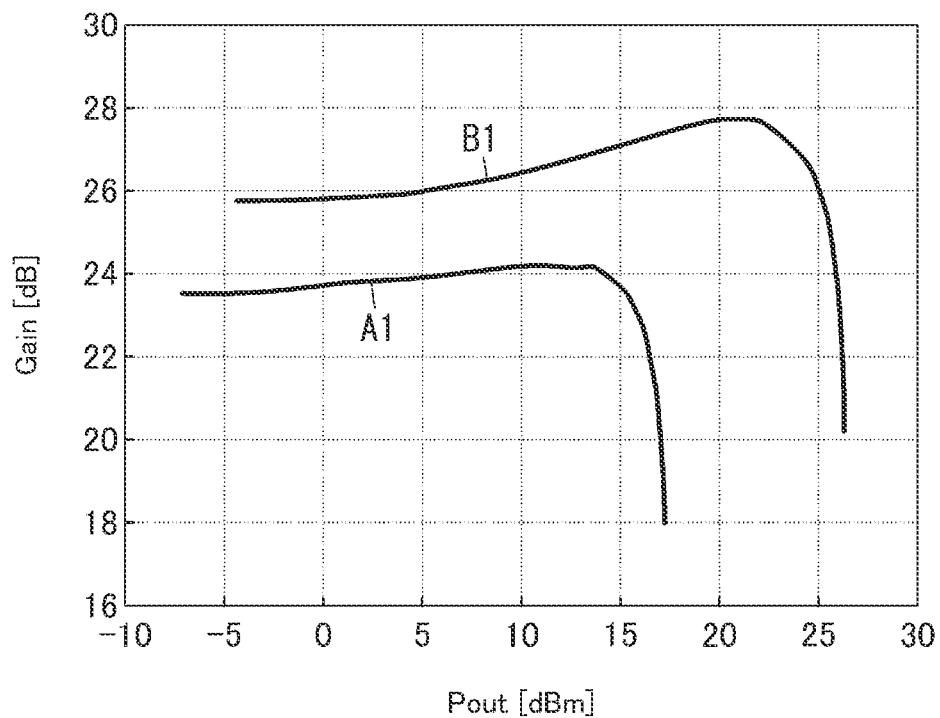
FIG. 3 is a diagram illustrating characteristics between gain and output power of the power amplification circuit.

FIG. 3 illustrates characteristics between gain and output power of the power amplification circuit 10. In FIG. 3, the horizontal axis represents the output power Pout of the power amplification circuit 10, and the vertical axis represents the gain of the power amplification circuit 10. In FIG.

3, the solid line A1 illustrates characteristics between gain and output power which are obtained when, among the first to fourth transistors Q1 to Q4, only two transistors of the second transistor Q2 and the third transistor Q3 are operated in the power amplification circuit 10. The solid line A1 in FIG. 3 illustrates characteristics between gain and output power of the power amplification circuit 10 which are obtained when the second transistor Q2 is supplied with the second bias current I2 and the third transistor Q3 is supplied with the third bias current I3. In FIG. 3, the solid line B1 illustrates characteristics between gain and output power which are obtained when, among the first to fourth transistors Q1 to Q4, only two transistors of the first transistor Q1 and the third transistor Q3 are operated in the power amplification circuit 10. That is, the solid line B1 in FIG. 3 illustrates characteristics between gain and output power of the power amplification circuit 10 which are obtained when the first transistor Q1 is supplied with the first bias current I1 and the third transistor Q3 is supplied with the third bias current I3.

From FIG. 3, it is found that, compared with the case in which the first transistor Q1 and the third transistor Q3 are operated and the second transistor Q2 is not operated, the power amplification circuit 10 enables a larger gain to be suppressed in operation in the low-power mode in which the second transistor Q2 and the third transistor Q3 are operated and the first transistor Q1 is not operated. The reason why the case, in which the second transistor Q2 is operated, may cause a larger gain to be suppressed compared with the case, in which the first transistor Q1 is operated, is that the second resistor R2 has a resistance value greater than that of the first resistor R1, and that the voltage drop across the second resistor R2 is larger than that across the first resistor R1.

(4) Specific Configuration Examples of the Power Amplification Circuit and the Control Circuit (4.1) The Power Amplification Circuit For example, the power amplification circuit 10 is included in a single IC chip. An IC chip including the power amplification circuit 10 is, for example, a GaAs based IC chip. In this case, the bipolar transistors included in the first transistor Q1, the second transistor Q2, the third transistor Q3, and the fourth transistor Q4 are, for example, HBTs (Heterojunction Bipolar Transistors). Each of the first transistor Q1, the second transistor Q2, the third transistor Q3, and the fourth transistor Q4 is, for example, a multi-finger transistor in which multiple unit transistors (also referred to as fingers) are connected to each other in parallel. A unit transistor refers to the minimum configuration for forming a transistor.

When the power amplification circuit 10 is included in a single IC chip, the first base terminal (first input terminal 11), the first collector terminal (first output terminal 12), and the first emitter terminal (first ground terminal 13) of the first transistor Q1 are the base electrode, the collector electrode, and the emitter electrode, respectively, of the first transistor Q1 in the IC chip. Similarly, the second base terminal (second input terminal 21), the second collector terminal (second output terminal 22), and the second emitter terminal (second ground terminal 23) of the second transistor Q2 are the base electrode, the collector electrode, and the emitter electrode, respectively, of the second transistor Q2 in the IC chip. Similarly, the third base terminal (third input terminal 31), the third collector terminal (third output terminal 32), and the third emitter terminal (third ground terminal 33) of the third transistor Q3 are the base electrode, the collector electrode, and the emitter electrode, respectively, of the third transistor Q3 in the IC chip. Similarly, the fourth base terminal (fourth input terminal 41), the fourth collector terminal (fourth output terminal 42), and the fourth emitter terminal (fourth ground terminal 43) of the fourth transistor Q4 are the base electrode, the collector electrode, and the emitter electrode, respectively, of the fourth transistor Q4 in the IC chip. When the power amplification circuit 10 is included in a single IC chip, multiple external connection electrodes (pad electrodes) for external connection included in the IC chip include the signal input terminal T1, the signal output terminal T2, the first power-supply terminal 111, the second power-supply terminal 112, and the third power-supply terminal 113. The multiple external connection electrodes for external connection included in the IC chip also include the ground terminal.

A transistor of a larger size tends to have smaller gain, and a transistor of a smaller size tends to have larger gain. A transistor, which is a multi-finger transistor, has, for example, more unit transistors if the size of the transistor increases, and has, for example, less unit transistors if the size of the transistors decreases. In the power amplification circuit 10 according to the first embodiment, the second transistor Q2 is smaller in size than the first transistor Q1. In the power amplification circuit 10 according to the first embodiment, for example, under the assumption that the size of a unit transistor of the second transistor Q2 is the same as that of the first transistor Q1, the number of unit transistors in the second transistor Q2 is less than that in the first transistor Q1.

(4.2) The Control Circuit

The control circuit 110 is included, for example, in a single IC chip different from that having the power amplification circuit 10. The IC chip including the control circuit 110 is, for example, an Si based IC chip. The control circuit 110 is, for example, a MOS IC (Metal Oxide Semiconductor Integrated Circuit) including multiple MOSFETs.

(5) Conclusion (5.1) The Power Amplification Circuit

The power amplification circuit 10 according to the first embodiment power-amplifies radio-frequency signals. The power amplification circuit 10 includes the first transistor Q1, the second transistor Q2, the first bias circuit 5, the second bias circuit 6, the first resistor R1, and the second resistor R2. The first transistor Q1 has the first input terminal 11, the first output terminal 12, and the first ground terminal 13. The second transistor Q2 has the second input terminal 21, the second output terminal 22, and the second ground terminal 23. The second transistor Q2 is connected to the first input terminal 11 at the second input terminal 21, and is connected to the first output terminal 12 at the second output terminal 22. The first bias circuit 5 is connected to the first input terminal 11. The second bias circuit 6 is connected to the second input terminal 21. The first resistor R1 is connected between the first ground terminal 13 and the ground. The second resistor R2 is connected between the second ground terminal 23 and the ground. The second resistor R2 has a resistance value greater than that of the first resistor R1.

The power amplification circuit 10 according to the first embodiment enables suppression of the gain. Among the first power mode and the second power mode of relatively low output power, the power amplification circuit 10 according to the first embodiment enables suppression of the gain obtained when the power amplification circuit 10 operates in the second power mode. When the power amplification circuit 10 according to the first embodiment operates in the first power mode, only the first transistor Q1 among the first transistor Q1 and the second transistor Q2 is used. When the power amplification circuit 10 according to the first embodiment operates in the second power mode, only the second transistor Q2 among the first transistor Q1 and the second transistor Q2 is used. Thus, the gain obtained when the power amplification circuit 10 operates in the second power mode may be suppressed.

In the power amplification circuit 10 according to the first embodiment, a current flowing through the first transistor Q1 in the first power mode is larger than a current flowing through the second transistor Q2 in the second power mode. However, since the first resistor R1 has a resistance value less than that of the second resistor R2, the voltage drop across the first resistor R1 may be made small.

In the power amplification circuit 10 according to the first embodiment, the first transistor Q1, the third transistor Q3, and the fourth transistor Q4 are used in the first power mode; in the second power mode in which the output power is lower than that in the first power mode, the second transistor Q2 and the third transistor Q3 are used. However, the configuration is not limited to this. In the second power mode, other than the combination of the second transistor Q2 and the third transistor Q3, for example, the combination of the second transistor Q2 and the fourth transistor Q4 may be used.

(5.2) The Radio-Frequency Circuit

The radio-frequency circuit 100 according to the first embodiment includes the power amplification circuit 10 and the control circuit 110. The control circuit 110 controls the power amplification circuit 10. Therefore, the radio-frequency circuit 100 according to the first embodiment enables suppression of the gain. Among the first power mode and the second power mode of relatively low output power, the radio-frequency circuit 100 according to the first embodiment enables suppression of the gain of the power amplification circuit 10 which is operated in the second power mode.

(5.3) The Communication Device

The communication device 300 according to the first embodiment includes the radio-frequency circuit 100 and the signal processing circuit 301. The signal processing circuit 301 outputs radio-frequency signals to the radio-frequency circuit 100.

The communication device 300 according to the first embodiment includes the radio-frequency circuit 100 having the power amplification circuit 10 described above, enabling suppression of the gain. Among the first power mode and the second power mode of relatively low output power, the communication device 300 according to the first embodiment enables suppression of the gain of the power amplification circuit 10 which is operated in the second power mode.

Second Embodiment

Figure 4:
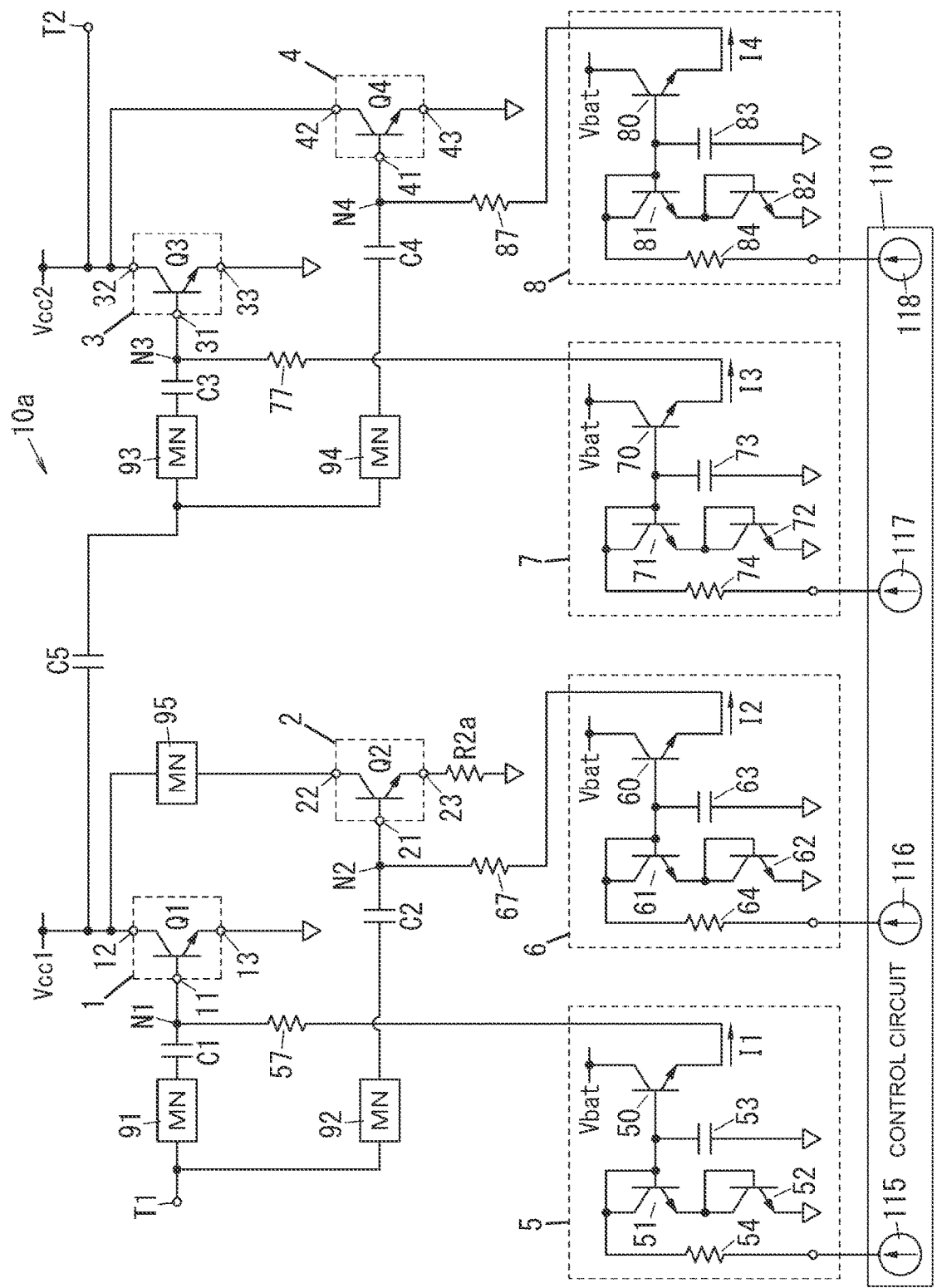
FIG. 4 is a circuit diagram of a power amplification circuit according to a second embodiment.

A power amplification circuit 10a according to a second embodiment will be described below by referring to FIG. 4. The components of the power amplification circuit 10a according to the second embodiment, which are substantially the same as those of the power amplification circuit 10 according to the first embodiment, are designated with the same reference characters, and will not be described. The power amplification circuit 10a according to the second embodiment may be used instead of the power amplification circuit 10 in the radio-frequency circuit 100 (see FIG. 2) and the communication device 300 (see FIG. 2) according to the first embodiment. In other words, the radio-frequency circuit 100 and the communication device 300 may include the power amplification circuit 10a according to the second embodiment instead of the power amplification circuit 10 according to the first embodiment.

The power amplification circuit 10a according to the second embodiment is different from the power amplification circuit 10 according to the first embodiment in that the first resistor R1 in the power amplification circuit 10 according to the first embodiment is not included. In addition, the power amplification circuit 10a according to the second embodiment is different from the power amplification circuit 10 according to the first embodiment in that a resistor R2a is included instead of the second resistor R2 in the power amplification circuit 10 according to the first embodiment.

In the power amplification circuit 10a, the resistor R2a is connected between the ground and the second ground terminal 23 of the second transistor Q2. In the power amplification circuit 10a, the resistance value between the ground and the second ground terminal 23 of the second transistor Q2 is greater than that between the ground and the first ground terminal 13 of the first transistor Q1. Any configuration may be employed as long as the resistance value of the resistor R2a is greater than that between the ground and the first ground terminal 13 of the first transistor Q1. The resistance value of the resistor R2a may be the same as or may be different from that of the second resistor R2. The resistance value of the resistor R2a is, for example, at least twice the resistance value between the ground and the first ground terminal 13 of the first transistor Q1.

In the power amplification circuit 10a according to the second embodiment, the resistance value between the ground and the second ground terminal 23 of the second transistor Q2 is greater than that between the ground and the first ground terminal 13 of the first transistor Q1. Thus, like the power amplification circuit 10 according to the first embodiment, the gain may be suppressed.

In the radio-frequency circuit 100 (see FIG. 2) including the power amplification circuit 10a according to the second embodiment instead of the power amplification circuit 10 according to the first embodiment, when the control circuit 110 causes the power amplification circuit 10a to operate in the first power mode, the control circuit 110 causes the first transistor Q1 to be supplied with the first bias (first bias current I1) from the first bias circuit 5, and does not cause the second transistor Q2 to be supplied with the second bias (second bias current I2) from the second bias circuit 6. When the control circuit 110 causes the power amplification circuit 10a to operate in the second power mode, the control circuit 110 does not cause the first transistor Q1 to be supplied with the first bias from the first bias circuit 5, and causes the second transistor Q2 to be supplied with the second bias from the second bias circuit 6.

Like the radio-frequency circuit 100 including the power amplification circuit 10, the radio-frequency circuit 100 including the power amplification circuit 10a may suppress the gain.

MODIFIED EXAMPLES

The embodiment described above is merely one of various embodiments of the present disclosure. The embodiment described above may be changed variously.

For example, the IC chip including the power amplification circuit 10 is not limited to a GaAs based IC chip, and, for example, may be an Si based IC chip including the power amplification circuit 10, an SiGe based IC chip including the power amplification circuit 10, or a GaN based IC chip including the power amplification circuit 10.

In the power amplification circuit 10, the first transistor Q1, the second transistor Q2, the third transistor Q3, and the fourth transistor Q4 are bipolar transistors. However, the configuration is not limited to this. For example, FETs (Field Effect Transistors) may be used. The FETs are, for example, MOSFETs (Metal-Oxide-Semiconductor Field Effect Transistors). When the first transistor Q1 is a MOSFET, the first input terminal 11, the first output terminal 12, and the first ground terminal 13 are, for example, a gate terminal, a drain terminal, and a source terminal. The first bias, which is supplied to the first input terminal 11 of the first transistor Q1 from the first bias circuit 5, is a first bias voltage. When the second transistor Q2 is a MOSFET, the second input terminal 21, the second output terminal 22, and the second ground terminal 23 are, for example, a gate terminal, a drain terminal, and a source terminal. The second bias, which is supplied to the second input terminal 21 of the second transistor Q2 from the second bias circuit 6, is a second bias voltage. When the third transistor Q3 is a MOSFET, the third input terminal 31, the third output terminal 32, and the third ground terminal 33 are, for example, a gate terminal, a drain terminal, and a source terminal. The third bias, which is supplied to the third input terminal 31 of the third transistor Q3 from the third bias circuit 7, is a third bias voltage. When the fourth transistor Q4 is a MOSFET, the fourth input terminal 41, the fourth output terminal 42, and the fourth ground terminal 43 are, for example, a gate terminal, a drain terminal, and a source terminal. The fourth bias, which is supplied to the fourth input terminal 41 of the fourth transistor Q4 from the fourth bias circuit 8, is a fourth bias voltage.

In the radio-frequency circuit 100, when the first transistor Q1, the second transistor Q2, the third transistor Q3, and the fourth transistor Q4 of the power amplification circuit 10 are MOSFETs, not HBTs, the power amplification circuit 10 and the control circuit 110 may be integrated into a single chip.

In the power amplification circuit 10, the second transistor Q2 is smaller in size than the first transistor Q1. However, the configuration is not limited to this. For example, the size of the second transistor Q2 may be substantially the same as that of the first transistor Q.

When the first transistor Q1, the second transistor Q2, the third transistor Q3, and the fourth transistor Q4 are MOSFETs, in the power amplification circuit 10, for example, the gate width of the MOSFET forming the second transistor Q2 is made shorter than that forming the first transistor Q1. Thus, the second transistor Q2 may be smaller in size than the first transistor Q1.

In the power amplification circuit 10, the number of stages of amplifier circuits is not limited to two, and may be three or more. In this case, the power amplification circuit 10 may further include, for example, an amplifier circuit between the driving-stage amplifier circuit and the output-stage amplifier circuit. In the power amplification circuit 10, the number of stages of amplifier circuits may be one. In this case, any configuration may be employed as long as the power amplification circuit 10 includes at least the first transistor Q1 and the second transistor Q2.

The number of transistors in the driving-stage amplifier circuit is not limited to two, and may be three or more. For example, in addition to the first transistor Q1 and the second transistor Q2, a transistor, which is connected to the first transistor Q1 in parallel, may be included.

In the power amplification circuit 10, instead of the configuration in which the first resistor R1 is connected between the ground and the first ground terminal 13 of the first transistor Q1, the first resistor R1 may be connected between the ground and the third ground terminal 33 of the third transistor Q3, and the second resistor R2 may be connected between the ground and the fourth ground terminal 43 of the fourth transistor Q4. In this case, the output-stage amplifier circuit may have any configuration as long as, in the first power mode, among the third transistor Q3 and the fourth transistor Q4, the third transistor Q3 is supplied with the third bias, and the fourth transistor Q4 is not supplied with the fourth bias, and, in the second power mode, the third transistor Q3 is not supplied with the third bias and the fourth transistor Q4 is supplied with the fourth bias.

In the radio-frequency circuit 100, the filter 103 is an acoustic wave filter using surface acoustic waves. However, the configuration is not limited to this. For example, an acoustic wave filter using boundary acoustic waves, plate waves, or the like may be used.

In the acoustic wave filter, each of the serial arm resonators and the parallel arm resonators is not limited to a SAW resonator, and, for example, may be a BAW (Bulk Acoustic Wave) resonator.

The radio-frequency circuit 100 may include a receive circuit having a low noise amplifier, which amplifies receive signals received from the antenna terminal 105, and a filter connected to the low noise amplifier.

The filter 103 is not limited to a transmit filter, and may be a duplexer.

In the radio-frequency circuit 100, the first switch 102 and the second switch 104 may be, for example, switch ICs compatible with a GPIO (General Purpose Input/Output).

(Aspects)

Aspects described below are disclosed in the present specification.

A power amplification circuit (10) according to a first aspect power-amplifies a radio-frequency signal. The power amplification circuit (10) includes a first transistor (Q1), a second transistor (Q2), a first bias circuit (5), a second bias circuit (6), a first resistor (R1), and a second resistor (R2). The first transistor (Q1) has a first input terminal (11), a first output terminal (12), and a first ground terminal (13). The second transistor (Q2) has a second input terminal (21), a second output terminal (22), and a second ground terminal (23). The second transistor (Q2) is connected to the first input terminal (11) at the second input terminal (21), and is connected to the first output terminal (12) at the second output terminal (22). The first bias circuit (5) is connected to the first input terminal (11). The second bias circuit (6) is connected to the second input terminal (21). The first resistor (R1) is connected between the first ground terminal (13) and the ground. The second resistor (R2) is connected between the second ground terminal (23) and the ground. The second resistor (R2) has a resistance value greater than the resistance value of the first resistor (R1).

The power amplification circuit (10) according to the first aspect enables suppression of the gain.

According to a second aspect, the power amplification circuit (10) according to the first aspect further includes a third transistor (Q3), a fourth transistor (Q4), a third bias circuit (7), and a fourth bias circuit (8). The third transistor (Q3) has a third input terminal (31), a third output terminal (32), and a third ground terminal (33). The third transistor (Q3) is connected to the first output terminal (12) at the third input terminal (31). The fourth transistor (Q4) has a fourth input terminal (41), a fourth output terminal (42), and a fourth ground terminal (43). The fourth transistor (Q4) is connected to the third input terminal (31) at the fourth input terminal (41), and is connected to the third output terminal (32) at the fourth output terminal (42).

The power amplification circuit (10) according to the second aspect enables the difference between the output power, which is obtained when the first transistor (Q1) is operated, and the output power, which is obtained when the second transistor (Q2) is operated, to make larger. For example, the power amplification circuit (10) according to the second aspect enables a radio-frequency signal, which has been amplified by the first transistor (Q1), to be amplified by the third transistor (Q3) and the fourth transistor (Q4), and enables a radio-frequency signal, which has been amplified by the second transistor (Q2), to be amplified by the third transistor (Q3) or the fourth transistor (Q4).

According to a third aspect, in the power amplification circuit (10) according to the first or second aspect, the second transistor (Q2) is smaller in size than the first transistor (Q1).

The power amplification circuit (10) according to the third aspect enables a current, which flows through the second transistor (Q2) when the second transistor (Q2) is operated, to be reduced.

According to a fourth aspect, in the power amplification circuit (10) according to any one of the first to third aspects, the second resistor (R2) has a resistance value of at least twice the resistance value of the first resistor (R1).

According to a fifth aspect, the power amplification circuit (10) according to any one of the first to fourth aspects further includes a signal input terminal (T1), a first matching circuit (91), and a second matching circuit (92). The radio-frequency signal is received at the signal input terminal (T1). The first matching circuit (91) is connected between the signal input terminal (T1) and the first input terminal (11) of the first transistor (Q1). The second matching circuit (92) is connected between the signal input terminal (T1) and the second input terminal (21) of the second transistor (Q2).

The power amplification circuit (10) according to the fifth aspect enables the first matching circuit (91) to be designed as a matching circuit dedicated to the first transistor (Q1), and enables the second matching circuit (92) to be designed as a matching circuit dedicated to the second transistor (Q2).

According to a sixth aspect, the power amplification circuit (10) according to any one of the first to fifth aspects further includes a matching circuit (95). The matching circuit (95) is connected between the first output terminal (12) of the first transistor (Q1) and the second output terminal (22) of the second transistor (Q2).

For example, the power amplification circuit (10) according to the sixth aspect enables the impedance in the low-power mode, in which the second transistor (Q2) is used, and the impedance in the high-power mode, in which the first transistor (Q1) is used, to be matched separately.

According to a seventh aspect, the power amplification circuit (10) according to any one of the first to sixth aspects is capable of operating in a first power mode and in a second power mode in which the output power is lower than that in the first power mode. When the power amplification circuit (10) operates in the first power mode, the first transistor (Q1) is supplied with a first bias (first bias current I1) from the first bias circuit (5), and the second transistor (Q2) is not supplied with a second bias (second bias current I2) from the second bias circuit (6). When the power amplification circuit (10) operates in the second power mode, the first transistor (Q1) is not supplied with the first bias (first bias current I1) from the first bias circuit (5), and the second transistor (Q2) is supplied with the second bias (second bias current I2) from the second bias circuit (6).

The power amplification circuit (10) according to the seventh aspect enables suppression of the gain obtained when the power amplification circuit (10) operates in the second power mode.

A radio-frequency circuit (100) according to an eighth aspect includes a power amplification circuit (10a) and a control circuit (110). The power amplification circuit (10a) power-amplifies a radio-frequency signal. The control circuit (110) controls the power amplification circuit (10a). The power amplification circuit (10a) includes a first transistor (Q1), a second transistor (Q2), a first bias circuit (5), a second bias circuit (6), and a resistor (R2a). The first transistor (Q1) has a first input terminal (11), a first output terminal (12), and a first ground terminal (13). The second transistor (Q2) has a second input terminal (21), a second output terminal (22), and a second ground terminal (23). The second transistor (Q2) is connected to the first input terminal (11) at the second input terminal (21), and is connected to the first output terminal (12) at the second output terminal (22). The first bias circuit (5) is connected to the first input terminal (11). The second bias circuit (6) is connected to the second input terminal (21). The resistor (R2a) is connected between the second ground terminal (23) and the ground. In the power amplification circuit (10a), the resistance value between the second ground terminal (23) and the ground is greater than the resistance value between the first ground terminal (13) and the ground. The power amplification circuit (10a) is capable of operating in a first power mode and in a second power mode in which the output power is lower than that in the first power mode. When the control circuit (110) causes the power amplification circuit (10a) to operate in the first power mode, the control circuit (110) causes the first transistor (Q1) to be supplied with a first bias (first bias current I1) from the first bias circuit (5), and does not cause the second transistor (Q2) to be supplied with a second bias (second bias current I2) from the second bias circuit (6). When the control circuit (110) causes the power amplification circuit (10a) to operate in the second power mode, the control circuit (110) does not cause the first transistor (Q1) to be supplied with the first bias (first bias current I1) from the first bias circuit (5), and causes the second transistor (Q2) to be supplied with the second bias (second bias current I2) from the second bias circuit (6).

The radio-frequency circuit (100) according to the eighth aspect enables suppression of the gain.

A communication device (300) according to a ninth aspect includes the radio-frequency circuit (100) according to the eighth aspect and a signal processing circuit (301). The signal processing circuit (301) outputs a radio-frequency signal to the radio-frequency circuit (100).

The communication device (300) according to the ninth aspect enables suppression of the gain.

REFERENCE SIGNS LIST

1 first amplifier
2 second amplifier
3 third amplifier
4 fourth amplifier
5 first bias circuit
6 second bias circuit
7 third bias circuit
8 fourth bias circuit
10, 10a power amplification circuit
11 first input terminal
12 first output terminal
13 first ground terminal 21 second input terminal
22 second output terminal
23 second ground terminal
31 third input terminal
32 third output terminal
33 third ground terminal
41 fourth input terminal
42 fourth output terminal
43 fourth ground terminal
50 transistor
51 diode
52 diode
53 capacitor
54 resistor
60 transistor
61 diode
62 diode
63 capacitor
64 resistor
67 resistor
70 transistor
71 diode
72 diode
73 capacitor
74 resistor
77 resistor
80 transistor
81 diode
82 diode
83 capacitor
84 resistor
87 resistor
91 first matching circuit
92 second matching circuit
93 third matching circuit
94 fourth matching circuit
95 matching circuit
100 radio-frequency circuit
101 output matching circuit
102 first switch
103 filter
104 second switch
105 antenna terminal
110 control circuit
111 first power-supply terminal
112 second power-supply terminal
113 third power-supply terminal
115 first constant-current source
116 second constant-current source
117 third constant-current source
118 fourth constant-current source
300 communication device
301 signal processing circuit
302 RF-signal processing circuit
303 baseband-signal processing circuit
304 switch
340 common terminal
341 first selection terminal
342 second selection terminal
310 antenna
321 envelope tracking modulator
322 constant-voltage source
C1 first capacitor
C2 second capacitor
C3 third capacitor
C4 fourth capacitor
C5 capacitor
I1 first bias current
I2 second bias current
I3 third bias current
I4 fourth bias current
N1 first node
N2 second node
N3 third node
N4 fourth node
R1 first resistor
R2 second resistor
R2a resistor
Q1 first transistor
Q2 second transistor
Q3 third transistor
Q4 fourth transistor
Vbat voltage
Vcc1 supply voltage
Vcc2 supply voltage

The invention claimed is:

1. A power amplification circuit configured to amplify a power of a radio-frequency signal, the power amplification circuit comprising:
a first transistor that has a first input terminal, a first output terminal, and a first ground terminal;
a second transistor that has a second input terminal, a second output terminal, and a second ground terminal, the second input terminal of the second transistor being connected to the first input terminal of the first transistor, and the second output terminal of the second transistor being connected to the first output terminal of the first transistor;
a third transistor that has a third input terminal, a third output terminal, and a third ground terminal, the third input terminal of the third transistor being connected to the first output terminal of the first transistor;
a fourth transistor that has a fourth input terminal, a fourth output terminal, and a fourth ground terminal, the fourth input terminal of the fourth transistor being connected to the third input terminal of the third transistor, and the fourth output terminal of the fourth transistor being connected to the third output terminal of the third transistor;
a first bias circuit connected to the first input terminal;
a second bias circuit connected to the second input terminal;
a third bias circuit connected to the third input terminal;
a fourth bias circuit connected to the fourth input terminal;
a first resistor connected between the first ground terminal and ground; and
a second resistor connected between the second ground terminal and ground,
wherein the second resistor has a resistance value greater than a resistance value of the first resistor.

2. The power amplification circuit according to claim 1, wherein the second transistor is smaller in size than the first transistor.

3. The power amplification circuit according to claim 1, wherein the second transistor has a higher gain than the first transistor.

4. The power amplification circuit according to claim 1, wherein the first and second transistors are multi-finger transistors, and the second transistor has fewer unit transistors than the first transistor.

5. The power amplification circuit according to claim 1, wherein the first and second transistors are the same size.

6. The power amplification circuit according to claim 1, wherein the second resistor has a resistance value that is at least twice a resistance value of the first resistor.

7. The power amplification circuit according to claim 1, further comprising:
 a signal input terminal configured to receive the radio-frequency signal;
 a first matching circuit connected between the signal input terminal and the first input terminal of the first transistor; and
 a second matching circuit connected between the signal input terminal and the second input terminal of the second transistor.

8. The power amplification circuit according to claim 1, further comprising:
 a matching circuit connected between the first output terminal of the first transistor and the second output terminal of the second transistor.

9. The power amplification circuit according to claim 1, wherein the power amplification circuit is configured to operate in a first power mode and in a second power mode, an output power of the power amplification circuit being lower in the second output mode than in the first power mode,
 wherein, when the power amplification circuit operates in the first power mode, the first bias circuit is configured to supply the first transistor with a first bias, and the second bias circuit is configured to not supply the second transistor with a second bias, and
 wherein, when the power amplification circuit operates in the second power mode, the first bias circuit is configured to not supply the first transistor with the first bias, and the second bias circuit is configured to supply the second transistor with the second bias.

10. A radio-frequency circuit comprising:
 a power amplification circuit configured to amplify a power of a radio-frequency signal; and
 a control circuit configured to control the power amplification circuit,
 wherein the power amplification circuit comprises:
  a first transistor that has a first input terminal, a first output terminal, and a first ground terminal,
  a second transistor that has a second input terminal, a second output terminal, and a second ground terminal, the second input terminal of the second transistor being connected to the first input terminal of the first transistor, and the second output terminal of the second transistor being connected to the first output terminal of the first transistor,
  a first bias circuit connected to the first input terminal,
  a second bias circuit connected to the second input terminal, and
  a resistor connected between the second ground terminal and ground,
 wherein, a resistance value between the second ground terminal and ground is greater than a resistance value between the first ground terminal and the ground,
 wherein the power amplification circuit is configured to operate in a first power mode and in a second power mode, an output power of the power amplification circuit being lower in the second output mode than in the first power mode,
 wherein, when the control circuit causes the power amplification circuit to operate in the first power mode, the control circuit is configured to cause the first transistor to be supplied with a first bias from the first bias circuit, and is configured to prevent the second transistor from being supplied with a second bias from the second bias circuit, and
 wherein, when the control circuit causes the power amplification circuit to operate in the second power mode, the control circuit is configured to prevent the first transistor from being supplied with the first bias from the first bias circuit, and is configured to cause the second transistor to be supplied with the second bias from the second bias circuit.

11. A communication device comprising:
the radio-frequency circuit according to claim 10; and
a signal processing circuit configured to output the radio-frequency signal to the radio-frequency circuit.

* * * * *